United States Patent
Lee

(10) Patent No.: US 7,042,780 B2
(45) Date of Patent: May 9, 2006

(54) SEMICONDUCTOR INTEGRATED CIRCUIT AND METHOD FOR DETECTING SOFT DEFECTS IN STATIC MEMORY CELL

(75) Inventor: Chan-ho Lee, Osan-si (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/858,994

(22) Filed: Jun. 2, 2004

(65) Prior Publication Data

US 2004/0245566 A1    Dec. 9, 2004

(30) Foreign Application Priority Data

Jun. 4, 2003    (KR) .................... 10-2003-0035904

(51) Int. Cl.
*G11C 7/00*    (2006.01)
(52) U.S. Cl. .................... 365/203; 365/201; 365/202; 365/205
(58) Field of Classification Search ................ 365/203, 365/201, 202, 205
See application file for complete search history.

(56) References Cited

U.S. PATENT DOCUMENTS

| | | | |
|---|---|---|---|
| 4,379,344 A * | 4/1983 | Ozawa et al. ................ | 365/203 |
| 4,685,086 A | 8/1987 | Tran ............................ | 365/203 |
| 5,361,232 A | 11/1994 | Petschauer et al. ......... | 365/201 |
| 5,953,261 A * | 9/1999 | Furutani et al. ....... | 265/189.05 |
| 6,430,097 B1 * | 8/2002 | Itou ............................ | 365/201 |
| 6,453,433 B1 * | 9/2002 | Vollrath ..................... | 714/718 |
| 6,631,092 B1 * | 10/2003 | Yamasaki ................... | 365/201 |
| 6,753,721 B1 * | 6/2004 | Otsuka et al. .............. | 327/540 |

FOREIGN PATENT DOCUMENTS

| | | |
|---|---|---|
| KR | 1998-042008 | 8/1998 |
| KR | 1998-081090 | 11/1998 |
| KR | 10-2004-0105058 | 12/2004 |
| KR | 10-2004-0105059 | 12/2004 |

\* cited by examiner

*Primary Examiner*—Connie C. Yoha
(74) *Attorney, Agent, or Firm*—Mills & Onello, LLP

(57) ABSTRACT

Provided are a semiconductor integrated circuit including a unit which detects soft defects in a pull-up circuit of a static memory cell, and a soft defect detection method and a testing method thereof. The semiconductor integrated circuit includes a static memory cell, a bit line connected to a first node of the static memory cell and a complementary bit line connected to a second node of the static memory cell, and an equalization circuit connected to the bit line and the complementary bit line to equalize the bit line and the complementary bit line in response to a test signal during a test mode. The semiconductor integrated circuit and the soft defect detection method can rapidly detect soft defects in the pull-up circuit of the static memory cell without a retention test. Furthermore, the testing method can rapidly detect soft defects in the pull-up circuit of the static memory cell, allowing the test time to be drastically reduced.

5 Claims, 6 Drawing Sheets

SEMICONDUCTOR INTEGRATED CIRCUIT AND METHOD FOR DETECTING SOFT DEFECTS IN STATIC MEMORY CELL

BACKGROUND OF THE INVENTION

This application claims the priority of Korean Patent Application No. 2003-35904, filed on Jun. 4, 2003, in the Korean Intellectual Property Office, the contents of which are incorporated herein in their entirety by reference.

1. Field of the Invention

The present invention relates to a semiconductor integrated circuit, and more particularly, to a semiconductor integrated circuit comprising a unit which detects soft defects in a static memory cell, a method of detecting soft defects, and a method of testing the semiconductor integrated circuit for soft defects.

2. Description of the Related Art

Many complementary metal oxide semiconductor (CMOS) static random access memories (SRAMs) utilize four transistors per memory cell. However, due to some advantages, a six transistor cell approach is, gaining in popularity. These advantages include higher operational stability, higher alpha-particle immunity, and a simpler process.

A primary disadvantage of the six transistor memory cell CMOS SRAM is that open circuit failures in a pull-up circuit of the memory cell can appear as soft defects. Because such faults do not result in a hard failure, testing and failure analysis have proven to be particularly difficult. A method of testing a CMOS SRAM device for soft defects in a pull-up circuit is disclosed in U.S. Pat. No. 5,361,232.

FIG. 1 is a schematic diagram of a modeling circuit of a conventional six transistor static memory cell. FIG. 2 is a schematic diagram of a semiconductor integrated circuit including a plurality of static memory cells shown in FIG. 1.

Referring to FIG. 1, in the six transistor static memory cell, resistors R1, R2 and R3 are located between a power voltage VDD and pull-up transistors MP1 and MP2, and resistors R4 and R5 are located between the pull-up transistors MP1 and MP2 and internal nodes D and DB. Resistors R8, R9 and R10 are located between a ground voltage VSS and pull-down transistors MN3 and MN4, and resistors R6 and R7 are located between the pull-down transistors MN3 and MN4 and the internal nodes D and DB. Typically, the pull-up transistors MP1 and MP2 act as load transistors and the pull-down transistors MN3 and MN4 act as drive transistors.

Referring to the circuit diagram of FIG. 2, during a read operation, when a precharge signal PCH is initially at a logic "L", PMOS transistors 211, 213, and 215 within a precharge circuit 21 are turned on and a bit line BIT and a complementary bit line BITB are precharged to a power voltage VDD.

Next, when the precharge signal PCH is at a logic "H" and accordingly, the PMOS transistors 211, 213, 215 within the precharge circuit 21 are turned off and one of word lines WL1 through WLn is activated to a logic "H", one of memory cells M1 through Mn is selected and data D and complementary data DB stored in the selected memory cell are output to the bit line BIT and the complementary bit line BITB, respectively.

After a suitable time delay, a sense enable signal SAEN is activated to a logic "H", and a sensor amplifier 23 senses and amplifies a voltage difference between the bit line BIT and the complementary bit line BITB and outputs the result as output data.

If soft defects exist in the pull-up circuits of the memory cell, that is, if leakage current continuously flows to a node having data "1", for example, the node DB, or if the resistances of the resistors R1 through R5 increase for some reason and thus a sufficient amount of current is not applied to the node DB having data "1", the node DB gradually discharges. That is to say, the voltage level of the node DB gradually decreases. As a result, when the voltage of the node DB exceeds a logic threshold voltage of an inverter within the memory cell, data stored in the memory cell are toggled.

For the purpose of screening memory cells having such soft defects, a retention test is typically run. However, the time taken to discharge the node DB is so long that the retention test time needs to be of very long duration in order to detect the defects.

SUMMARY OF THE INVENTION

The present invention provides a semiconductor integrated circuit including a unit which rapidly detects soft defects in a pull-up circuit of a static memory cell without a retention test.

The present invention also provides a method of rapidly detecting soft defects in a pull-up circuit in a static memory cell without a retention test.

The present invention further provides a testing method for rapidly detecting soft defects in a pull-up circuit of a static memory cell.

According to an aspect of the present invention, there is provided a semiconductor integrated circuit comprising: a static memory cell; a bit line connected to a first node of the static memory cell; a complementary bit line connected to a second node of the static memory cell; and an equalization circuit, connected to the bit line and the complementary bit line, which equalizes the bit line and the complementary bit line in response to a test signal during a test mode.

The semiconductor integrated circuit may further comprise: a precharge circuit, connected to the bit line and the complementary bit line, which precharges the bit line and the complementary bit line in response to a precharge signal; and a sense amplifier, connected to the bit line and the complementary bit line, which senses and amplifies a voltage difference between the bit line and the complementary bit line in response to a sense enable signal.

The equalization circuit may include a PMOS transistor, an NMOS transistor, or a transmission gate.

According to another aspect of the present invention, there is provided a method of detecting soft defects in a static memory cell of a semiconductor integrated circuit including a static memory cell selected by activation of a word line, a bit line connected to a first node of the static memory cell, and a complementary bit line connected to a second node of the static memory cell, the method comprising: writing data in the static memory cell; equalizing the bit line and the complementary bit line in response to a test signal; activating the word line; and sensing and amplifying a voltage difference between the bit line and the complementary bit line in response to a sense enable signal.

In the voltage difference sensing and amplifying step, when inverted data of data previously written in the memory cell are read out, it may be determined that the memory cell is vulnerable to soft defects.

According to another aspect of the present invention, there is provided a method of testing a semiconductor integrated circuit including a plurality of static memory cells respectively selected by activation of word lines, a bit line connected to first nodes of the static memory cells, and a complementary bit line connected to second nodes of the static memory cells, the method comprising: writing the same data in the each of memory cells; continuously precharging the bit line and the complementary bit line during a test mode; continuously activating a test signal during the test mode to continuously equalize the bit line and the complementary bit line; sequentially activating the word lines of the plurality of static memory cells; and sensing and amplifying a voltage difference between the bit line and the complementary bit line in response to a sense enable signal.

BRIEF DESCRIPTION OF THE DRAWINGS

The foregoing and other features and advantages of the invention will be apparent from the more particular description of an embodiment of the invention, as illustrated in the accompanying drawing. The drawing is not necessarily to scale, emphasis instead being placed upon illustrating the principles of the invention.

DETAILED DESCRIPTION OF THE INVENTION

Figure 3:
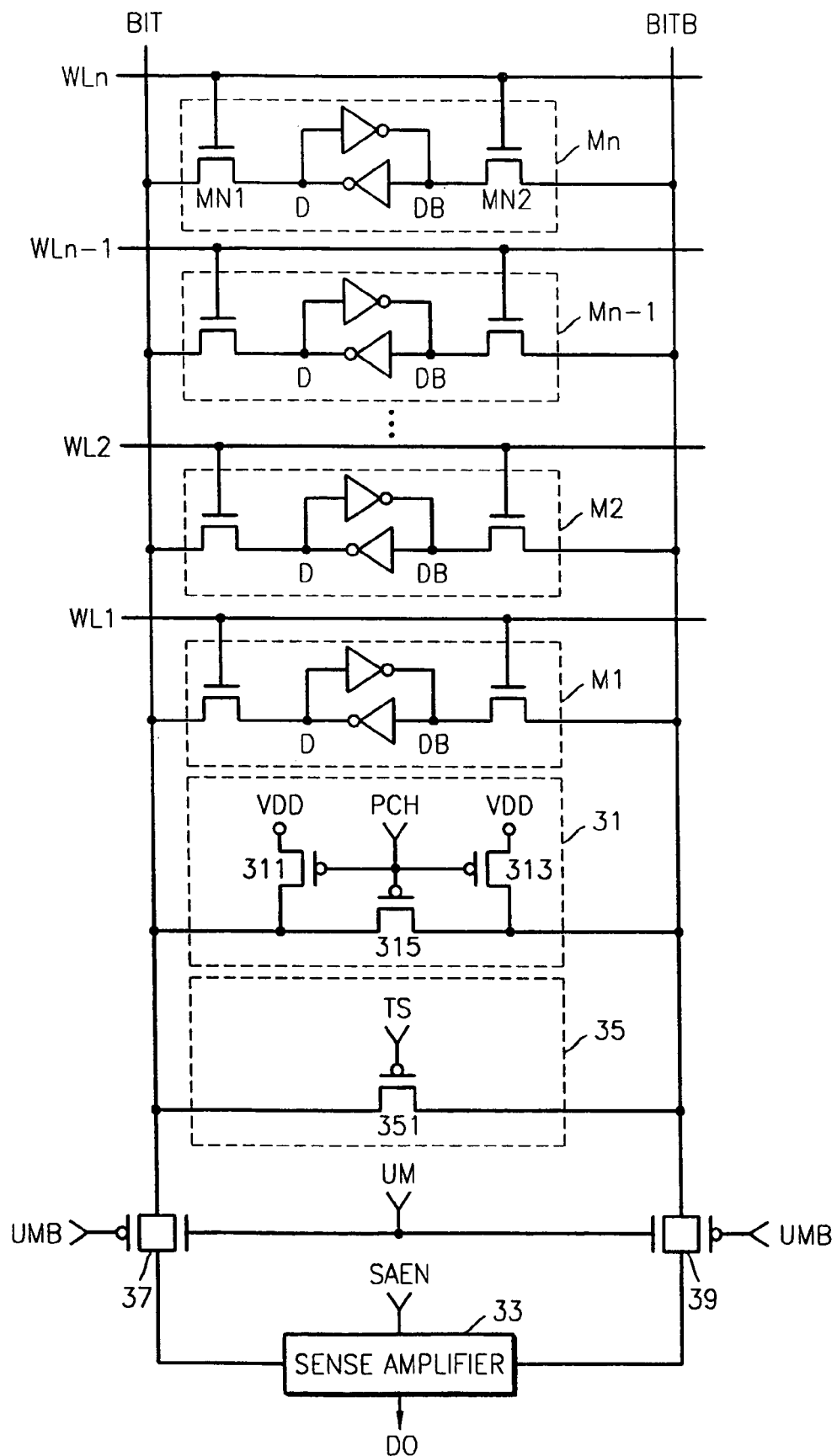
FIG. 3 is a diagram of a semiconductor integrated circuit including a unit for detecting soft defects according to an embodiment of the present invention.

FIG. 3 is a schematic diagram of a semiconductor integrated circuit including a unit for detecting soft defects according to an embodiment of the present invention.

Referring to FIG. 3, the semiconductor integrated circuit includes a plurality of static memory cells M1 through Mn, a bit line BIT, a complementary bit line BITB, a precharge circuit 31, switches 37 and 39, and a sense amplifier 33. The semiconductor integrated circuit of the present embodiment further includes an equalization circuit 35.

One node of each of the static memory cells M1 through Mn is connected to the bit line BIT, and another node of each of the static memory cells M1 through Mn is connected to the complementary bit line BITB. The precharge circuit 31 is connected to the bit line BIT and the complementary bit line BITB, and precharges the bit line BIT and the complementary bit line BITB in response to a precharge signal PCH.

The switches 37 and 39 control connections between the bit line BIT and the complementary bit line BITB and the sense amplifier 33. While the switches 37 and 39 are turned on, the sense amplifier 33 senses and amplifies a voltage difference between the bit line BIT and the complementary bit line BITB in response to a sense enable signal SAEN, and outputs the result.

In particular, the equalization circuit 35 is connected to the bit line BIT and the complementary bit line BITB, and equalizes the bit line BIT and the complementary bit line BITB in response to a test signal TS. Here, the equalization circuit 35 is connected between the bit line BIT and the complementary bit line BITB, and includes a PMOS transistor 351 having a gate to which the test signal TS is input. The equalization circuit 35 may include an NMOS transistor or a transmission gate according to its needs.

Figure 4:
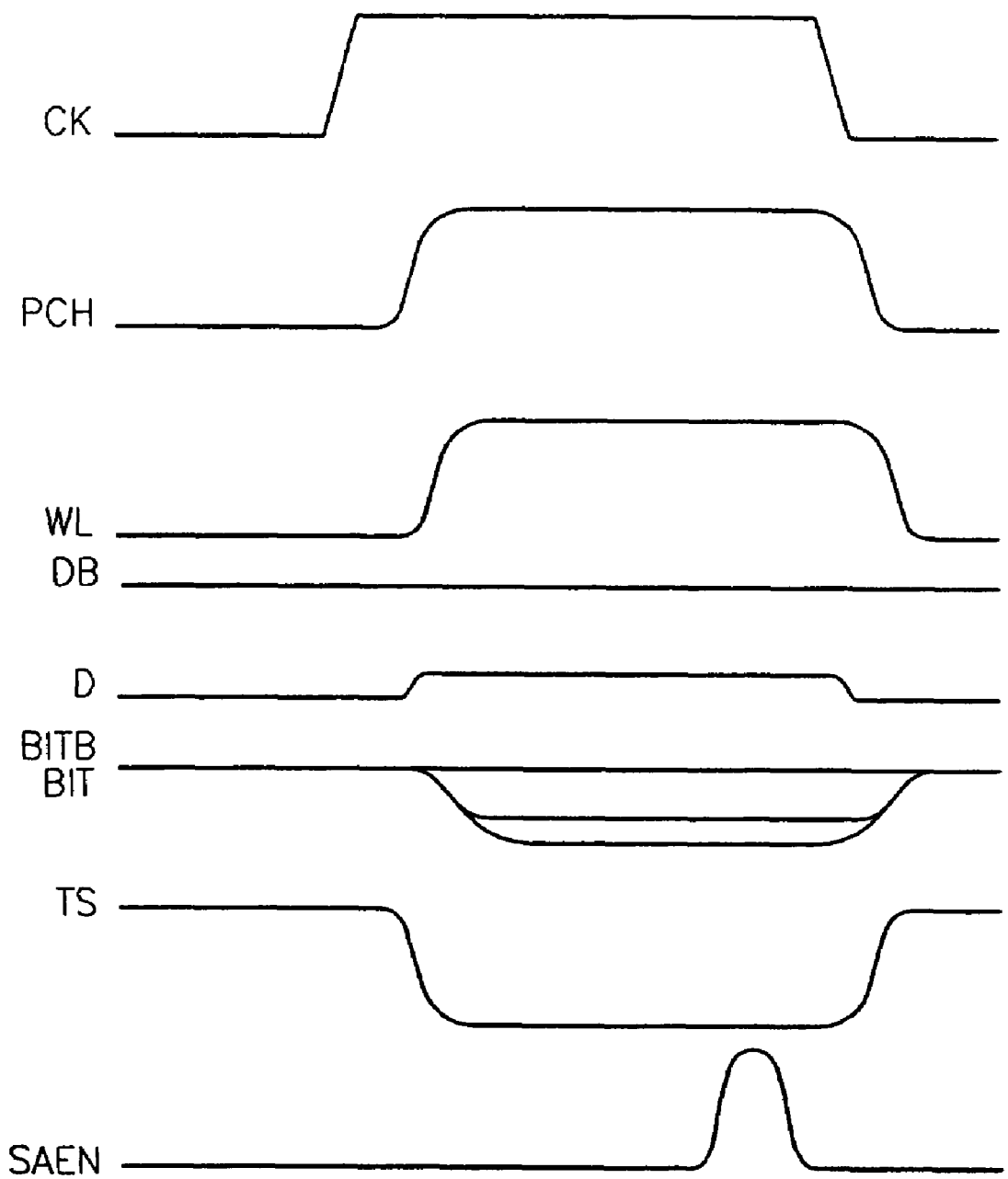
FIG. 4 is a timing diagram of a read operation of a memory cell without soft defects in the semiconductor integrated circuit of FIG. 3.
Figure 5:
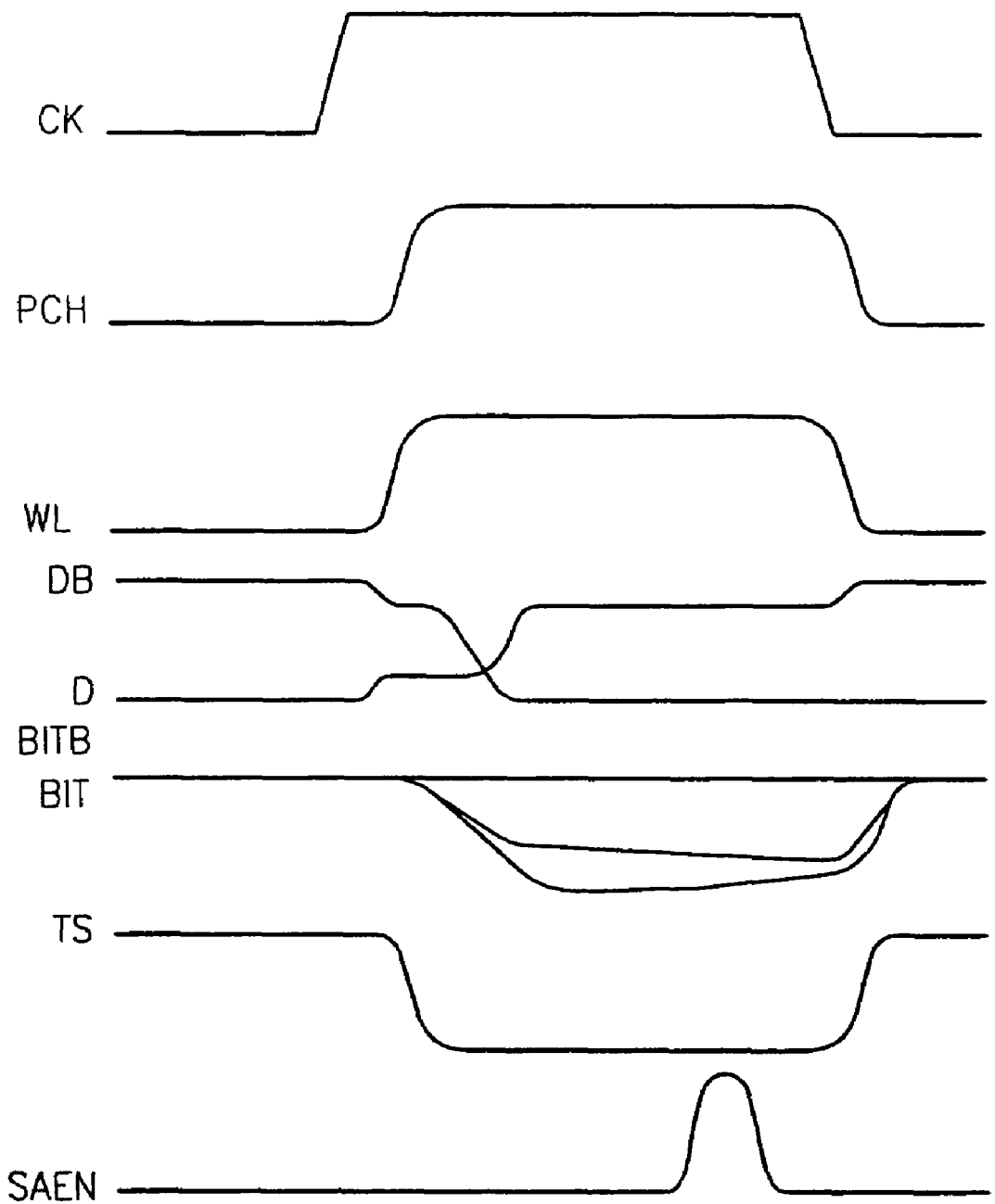
FIG. 5 is a timing diagram of a read operation of a memory cell with soft defects in the semiconductor integrated circuit of FIG. 3.

FIG. 4 is a timing diagram of a read operation of a memory cell without soft defects in the semiconductor integrated circuit of FIG. 3. FIG. 5 is a timing diagram of a read operation of a memory cell with soft defects in the semiconductor integrated circuit of FIG. 3.

A method of detecting soft defects in pull-up circuits of the static memory cells M1 through Mn shown in FIG. 3 will be described with reference to FIGS. 4 and 5.

When the precharge signal PCH is initially at a logic "L" in the circuit of FIG. 3 during a read operation, PMOS transistors 311, 313, and 315 within the precharge circuit 31 are turned on such that the bit line BIT and the complementary bit line BITB are precharged to a power voltage VDD.

Next, when the precharge signal PCH is at a logic "H", one of a plurality of word lines WL1 through WLn is activated to a logic "H", and the test signal TS is activated to a logic "L", the PMOS transistors 311, 313 and 315 within the precharge circuit 31 are turned off and the PMOS transistor 351 of the equation circuit 35 is turned on.

Figure 1:
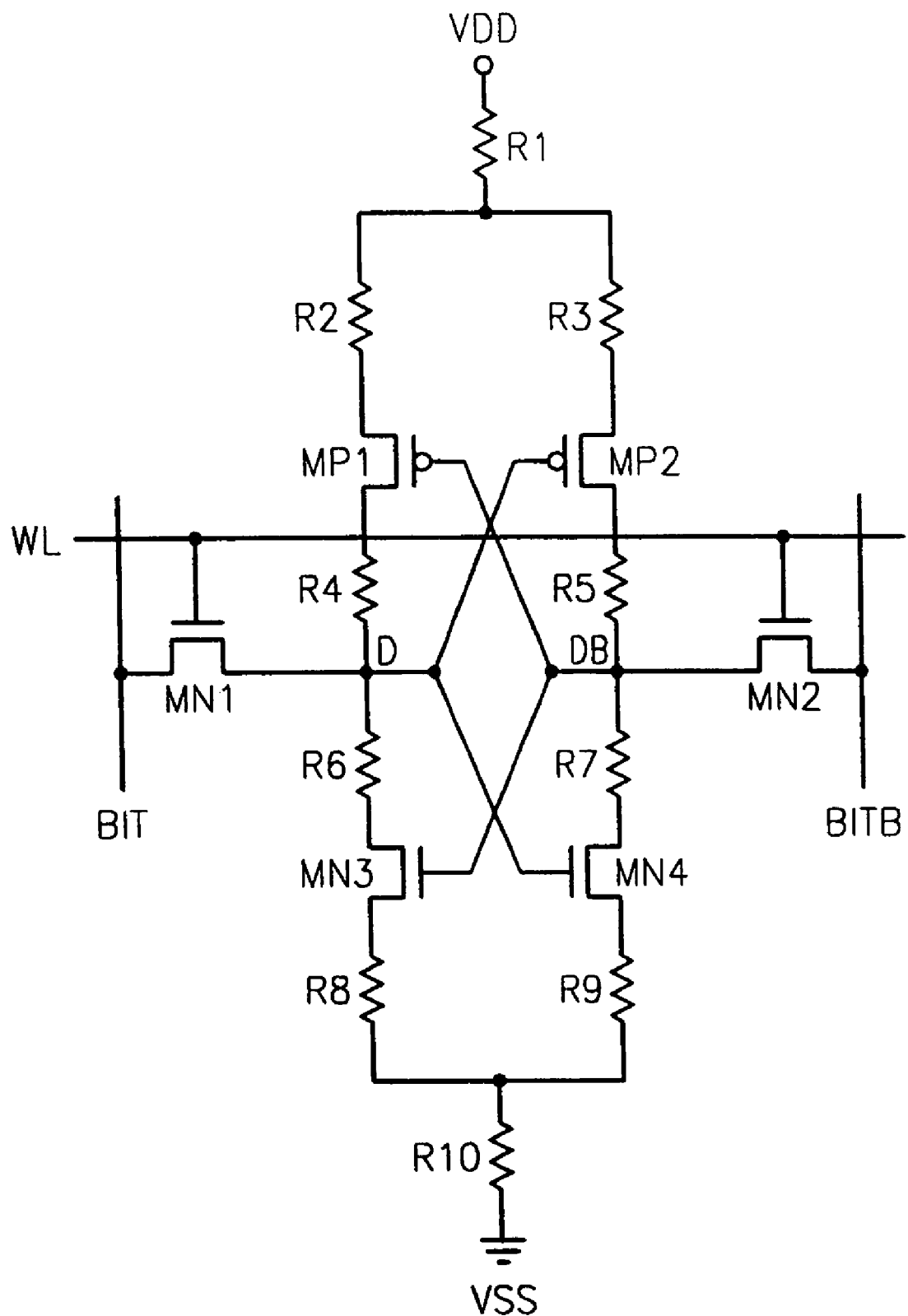
FIG. 1 is a schematic diagram of a modeling circuit of a conventional six transistor static memory cell.
Figure 2:
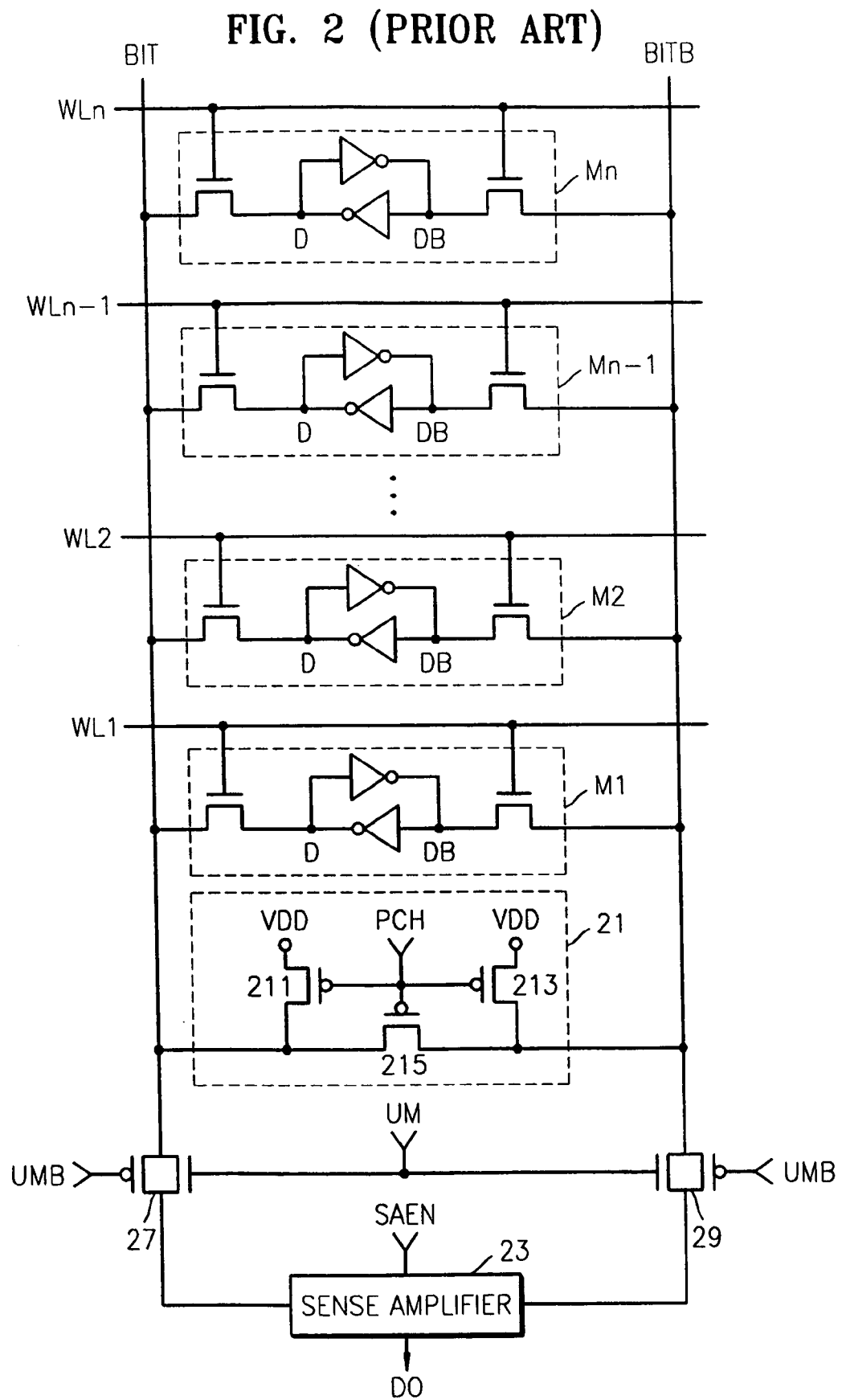
FIG. 2 is a schematic diagram of a semiconductor integrated circuit including the static memory cells shown in FIG. 1.

Accordingly, the bit line BIT connected to a node having data "0" of a selected memory cell, for example, the node D, is discharged via a pass transistor MN1 and a drive NMOS transistor MN3 (see FIG. 1). In addition, the complementary bit line BITB connected to a node having data "1", for example, the node DB, is discharged via a pass transistor MN2 and the drive NMOS transistor MN3.

If soft defects occur in the pull-up circuit of the selected memory cell, that is, if leakage current continuously flows to the node DB having data "1" in the selected memory cell or if the resistances of the resistors R1 through R5 increase too much for some reason and thus a sufficient amount of current is not supplied to the node DB having data "1", the voltages of the node DB and the complementary bit line BITB decrease so much, as shown in the timing diagram of FIG. 5, that their voltages exceed a logic threshold voltage of an inverter within the memory cell. As a result, data stored in the memory cell are toggled.

It is determined that the memory cell whose data are toggled during the read operation, that is to say, the memory cell having the inverted value of previously written data, has soft defects.

If any soft defects do not occur in the pull-up circuit of the selected memory cell, that is, if leakage current does not flow to the node DB having data "1" in the selected memory cell or if the resistances of the resistors R1 through R5 do not increase too much and thus a sufficient amount of current is supplied to the node DB, the voltages of the node DB and the complementary bit line BITB do not decrease so much that their voltages exceed the logic threshold voltage of the inverter within the memory cell. As a result, data stored in the memory cell are preserved.

It is determined that the memory cell whose data are preserved during the read operation, that is to say, the memory cell having the same data values as previously written data, has no soft defects.

The requirements for detecting memory cells having soft defects can be determined by adjusting the width or the length of the PMOS transistor 351 of the equation circuit 35 to adjust the resistance of the PMOS transistor 351.

As shown in FIGS. 4 and 5, a cycle time sufficient to allow the bit line BIT to completely discharge is required to test whether or not one memory cell has soft defects. If the memory cell has a high memory capacity, it is possible that the aforesaid testing method requires more time than the retention test method. Therefore, a testing method of rapidly detecting soft defects in the pull-up circuit of the selected memory cell is needed.

Figure 6:
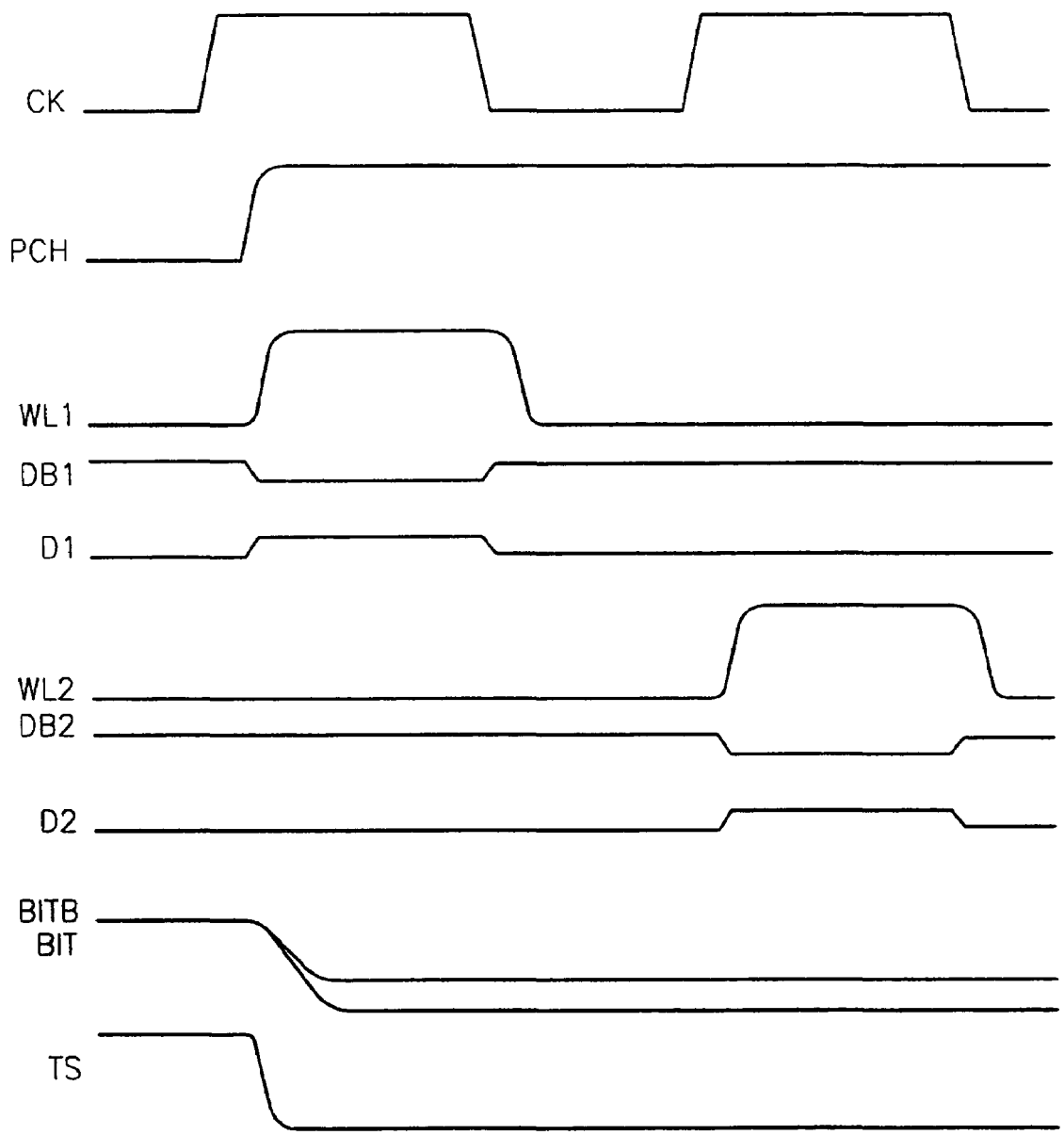
FIG. 6 is a timing diagram of a testing method according to an embodiment of the present invention.

FIG. 6 is a timing diagram of a testing method for rapidly detecting soft defects in the pull-up circuit of the memory cell according to an embodiment of the present invention.

In the testing method, the same data are written in each of the plurality of memory cells. During a test mode, the precharge signal PCH is continuously deactivated to a logic "H", so as not to continuously precharge the bit line BIT and the complementary bit line BITB. Furthermore, during the test mode, the test signal TS is continuously activated to a logic "L" to continuously equalize the bit line BIT and the complementary bit line BITB.

Next, the plurality of word lines WL1 through WLn of the plurality of memory cells are sequentially activated. A voltage difference between the bit line BIT and the complementary bit line BITB is then sensed and amplified by the sense amplifier 33 in response to the sense enable signal SAEN.

In the testing method according to the present invention, while the precharge signal PCH is continuously deactivated to a logic "H" and the test signal TS is continuously activated to a logic "L" during the test mode, only the word lines WL1 through WLn are sequentially activated. Therefore, the test time is drastically reduced.

As described above, the semiconductor integrated circuit and the soft defect detection method according to the present invention can rapidly detect soft defects in the pull-up circuit of the static memory cell without a retention test. Furthermore, the testing method according to the present invention can rapidly detect soft defects in the pull circuit of the static memory cell, allowing the test time to be drastically reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor integrated circuit comprising:
   a static memory cell;
   a bit line connected to a first node of the static memory cell;
   a complementary bit line connected to a second node of the static memory cell;
   a precharge circuit, connected to the bit line and the complementary bit line, which precharges the bit line and the complementary-bit line in response to a precharge signal; and
   an equalization circuit, independent from the precharge circuit, connected to the bit line and the complementary bit line, which equalizes the bit line and the complementary bit line in response to a single test signal during a test mode.

2. The semiconductor integrated circuit of claim 1, further comprising:
   a sense amplifier, connected to the bit line and the complementary bit line, which senses and amplifies a voltage difference between the bit line and the complementary bit line in response to a sense enable signal.

3. The semiconductor integrated circuit of claim 1, wherein the equalization circuit includes a PMOS transistor.

4. The semiconductor integrated circuit of claim 1, wherein the equalization circuit includes an NMOS transistor.

5. The semiconductor integrated circuit of claim 1, wherein the equalization circuit includes a transmission gate.

* * * * *